(12) United States Patent
Ruething et al.

(10) Patent No.: US 8,860,133 B2
(45) Date of Patent: Oct. 14, 2014

(54) SEMICONDUCTOR COMPONENT

(71) Applicant: Infineon Technologies Austria AG, Villach (AT)

(72) Inventors: Holger Ruething, Munich (DE); Frank Pfirsch, Munich (DE); Armin Willmeroth, Augsburg (DE); Frank Hille, Munich (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/722,419

(22) Filed: Dec. 20, 2012

(65) Prior Publication Data

US 2013/0113087 A1    May 9, 2013

Related U.S. Application Data

(62) Division of application No. 11/924,115, filed on Oct. 25, 2007, now Pat. No. 8,344,415.

(30) Foreign Application Priority Data

Oct. 25, 2007  (DE) .......................... 10 2006 050 338

(51) Int. Cl.
| | | |
|---|---|---|
| H01L 29/73 | (2006.01) | |
| H01L 29/739 | (2006.01) | |
| H01L 29/08 | (2006.01) | |
| H01L 29/06 | (2006.01) | |
| H01L 21/22 | (2006.01) | |
| H01L 29/36 | (2006.01) | |

(52) U.S. Cl.
CPC ............ *H01L 29/36* (2013.01); *H01L 29/7395* (2013.01); *H01L 29/0834* (2013.01); *H01L 29/0696* (2013.01); *H01L 29/7397* (2013.01); *H01L 21/22* (2013.01)
USPC ............................................ 257/335; 257/655

(58) Field of Classification Search
USPC ......... 257/119, 124, 130–134, 139, 153, 156, 257/163–164, E29.027, E29.197, E29.201, 257/335, 655
See application file for complete search history.

(56) References Cited

U.S. PATENT DOCUMENTS

| | | |
|---|---|---|
| 7,112,868 B2 | 9/2006 | Willmeroth et al. |
| 7,400,017 B2 | 7/2008 | Aono et al. |
| 2007/0080407 A1 | 4/2007 | Kono |

FOREIGN PATENT DOCUMENTS

| | | |
|---|---|---|
| DE | 10250575 | 5/2004 |
| DE | 102005018366 | 11/2005 |
| DE | 102005019178 | 11/2006 |

OTHER PUBLICATIONS

Non-Final Office Action mailed Jun. 8, 2010 in U.S. Appl. No. 11/924,115.

*Primary Examiner* — Tran Tran
(74) *Attorney, Agent, or Firm* — Dicke, Billig & Czaja, PLLC

(57) ABSTRACT

A semiconductor component is disclosed. One embodiment provides a semiconductor body having a cell region with at least one zone of a first conduction type and at least one zone of a second conduction type in a rear side. A drift zone of the first conduction type in the cell region is provided. The drift zone contains at least one region through which charge carriers flow in an operating mode of the semiconductor component in one polarity and charge carriers do not flow in an operating mode of the semiconductor component in an opposite polarity.

9 Claims, 10 Drawing Sheets

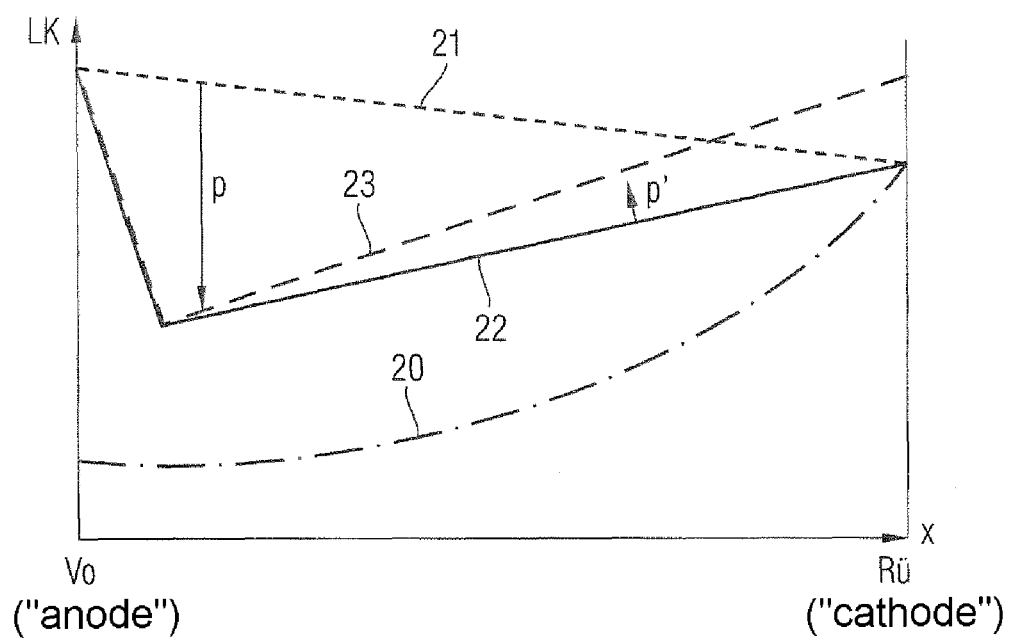

SEMICONDUCTOR COMPONENT

CROSS-REFERENCE TO RELATED APPLICATIONS

This Utility Patent Application is a divisional application of U.S. application Ser. No. 11/924,115, filed Oct. 25, 2007, and claims priority to German Patent Application No. DE 10 2006 050 338.4 filed on Oct. 25, 2007, which is incorporated herein by reference.

BACKGROUND

The present invention relates to a semiconductor component. In one embodiment, a semiconductor component is provided, having a soft diode behavior.

For a fast and low-loss switching behavior, the behavior of semiconductor structures is intended to proceed such that it is as "soft" as possible. The semiconductor component can be an IGBT with backward diode.

The description is given on the basis of an IGBT, but this does not signify any restriction. Rather, a "semiconductor component" can also be understood to mean for example a combination of an IGBT with a MOSFET or a Schottky diode.

For an IGBT which can be operated in a diode operating mode and in an IGBT operating mode, a diode operating mode can usually take place in opposite polarity with respect to the actual IGBT operating mode.

IGBTs configured in this way with RC-IGBT structures (reverse conducting IGBT structures) upon turn-on initially operate in a MOSFET operating mode, that is to say in a unipolar operating mode, in which no hole injection takes place from the rear side of the semiconductor body. It is only at higher currents that the rear-side p-conducting emitter zone turns on, such that holes are injected into the drift path and the semiconductor component then operates in the IGBT operating mode, that is to say a bipolar operating mode.

The changeover from the unipolar operating mode to the bipolar operating mode takes place when the electrons, which are the sole charge carriers of the current in the unipolar operating mode in the drift path and which flow away upstream of the p-conducting emitter zones transversely to the nearest n-conducting zone, produce an ohmic voltage drop upstream of the p-conducting emitter zones, which voltage drop excites the p-conducting emitter zones to effect a hole injection. The voltage drop must be approximately 0.7 V at room temperature.

This can mean that the current at which the changeover from the unipolar operating mode to the bipolar operating mode takes place can depend on the doping of the rear-side n-conducting emitter zones within the p-type emitter zones and can moreover likewise depend appreciably on the geometrical arrangement of the p-conducting and/or the n-conducting emitter zones: the greater the distance from one n-conducting zone to the next n-conducting zone on the rear side of the semiconductor body, the smaller the current possibly becomes which is required to produce the voltage drop of approximately 0.7 V.

It can follow from this that p-conducting emitter zones that are as wide as possible can be expedient for good on-state properties of the semiconductor component.

Simply enlarging the p-type zones can lead to widely distributed n-type zones, however. It may be desirable for the latter to be as close to one another as possible in order to be able to utilize the corresponding volume of the cell region of the semiconductor body or the corresponding cross-sectional region thereof for the diode operating mode.

The requirement of good on-state properties of the semiconductor component on account of wide p-conducting zones and n-conducting zones that are close together for a high current flow in the diode operating mode apparently cannot readily be fulfilled simultaneously with the requirements made with regard to a high diode softness or a low switching power loss.

One possibility for obtaining a soft diode behavior may be to reduce the local charge carrier lifetime near the front-side anode of the integrated diode. The anodal carrier flooding can thereby be reduced, which results in an increased diode softness. What is more, the reverse current peak and the total storage charge are reduced. However, this method has the effect that the collector-emitter saturation voltage VCESat increases as the reduction of the charge carrier lifetime increases. As a result, the degree of charge carrier lifetime reduction is limited since the on-state losses also increase with the increase of VCESat, which can lead to an excessively great heating of the semiconductor component.

A further approach for improving the diode softness may be to increase the doping concentration of the rear-side n-type emitter zone. The rear-side carrier flooding thereby increases, which increases the softness. However, this can in turn result in an increase in the storage charge and, consequently, in increasing switching losses of the diode and in increasing turn-on losses of the IGBT.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 3 illustrates characteristic curves of charge carrier concentrations in the course between front side and rear side of an IGBT according to the embodiment of FIGS. 2A and 2B.

DETAILED DESCRIPTION

Figure 1:
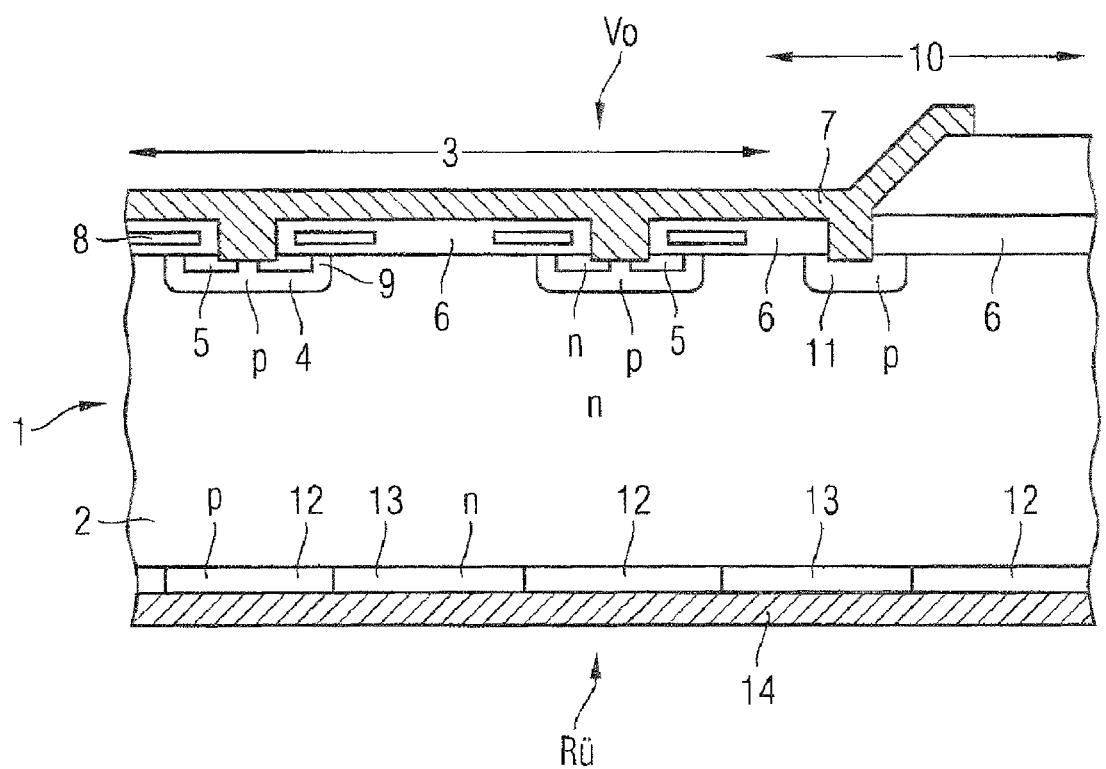
FIG. 1 illustrates a sectional illustration through an IGBT of planar embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The "first conduction type" is to be understood hereinafter to mean the n conduction type, in which n-type charge carriers are majority charge carriers. However, it is expressly emphasized that the first conduction type can, if appropriate, also be the p conduction type, in which p-type charge carriers are majority charge carriers.

In one exemplary embodiment of a semiconductor component, the rear side is structured in such a way that the drift zone contains in the cell region at least one region through which charge carriers do not flow in the diode operating mode of the semiconductor component, but through which charge carriers can flow in the IGBT operating mode. Charge carriers can flow through at least one further region within the drift zone both in the diode operating mode and in the IGBT operating mode.

Such a structuring of the rear side of the semiconductor component leads to an effective diode area which is smaller than the area of the cell region or smaller than the IGBT area. Diode softness can thereby be achieved by using an increased doping of the n-type diode emitter zones without the storage charge increasing.

It is thus possible for the p- and n-type zones to be structured within the effective diode zones in such a way that a changeover from a unipolar to a bipolar operating mode already takes place at low currents.

A suitable structuring can be achieved by virtue of the fact that at least one of the zones of the second conduction type contains a region configured in such a way that the minimum distance from the center of the region as far as that zone of the first conduction type which is closest to it is substantially greater than the corresponding minimum distance in the remaining zones or regions of the second conduction type.

In order to realize this minimum distance set as "substantially greater", it is possible for the zones of the first conduction type to be distributed virtually over the entire rear side of the semiconductor component and in one embodiment also in the cell region. Triggering regions which can bring about the changeover from the unipolar to the bipolar operating mode are simultaneously created here by the p-conducting emitter zones which are widened on account of the greater minimum distance.

The rear side of the semiconductor component can be subdivided into different regions. One region includes rear-side zones both of the first and of the second conduction type, while a second region includes exclusively rear-side zones of the second conduction type. It is also possible for a plurality of first and/or a plurality of second regions to be present.

The rear side of the semiconductor component can be configured in such a way that the minimum distance from the center of the at least one preferably p-conducting zone as far as the n-conducting zone which is closest to it or as far as the edge termination of the component is substantially greater than the corresponding minimum distance in the remaining p-conducting zones. "Substantially greater" can mean that the distance is at least a factor of 1.5 to 5 or more greater than the rest of the distances. Therefore, a uniform distribution of the respective zones is not present, under certain circumstances.

By using different dimensions (widths) for the p-conducting zones on the rear side of the semiconductor body, it is possible to achieve a restricted flowing of charge carriers through the drift zone in the diode operating mode, good IGBT properties, namely a triggering of the p-conducting zones at sufficiently low currents, and at the same time also particularly good diode properties, namely a high current flow through n-conducting emitter areas.

Continuous zones having identical distances between the n-type emitter zones with adjoining or intervening zones without n-type emitter zones can bring about the desired ensuring or restriction of the charge carrier flooding in different operating modes of the semiconductor component.

At least one region of the drift zone through which charge carriers do not flow in the diode operating mode can be achieved by virtue of the effective diode area being smaller than the area of the cell region or the IGBT area.

The actual diode area and the effective diode area emerge as follows from the above-described manner of arranging the p- and n-type zones. The actual area of the diode can correspond to the area of the rear-side n-type emitter zones. The effective diode area is for example the actual diode area together with that area of the drift zone outside the actual diode area which is flooded by charge carriers in the diode operating mode. This corresponds, therefore, to the maximum cross-sectional area in the plane of the semiconductor body of that volume in the drift zone through which charge carriers flow in the diode operating mode. The effective diode area, on account of the described arrangement of the rear-side emitter zones, can be smaller than the cell region, that is to say smaller than the area which is active in the bipolar operating mode of the IGBT—also referred to as IGBT area above—which corresponds to the top area of the drift zone.

To put it clearly, the rear side of the semiconductor body can contain at least one first region having zones both of the first and of the second conduction type and also at least one second region having zones of the second conduction type. In this case, the at least one second region can have a partial area which includes at least one circular area which is so large that there lie within the at least one second region subregions which are so far away from adjacent emitter zones of the first conduction type or from an edge zone of the semiconductor body that no charge carrier throughflow takes place within the subregions in the at least one second region in the diode operating mode. These arrangements can ensure, under certain circumstances, that the semiconductor body has within the drift zone regions through which charge carriers flow in a forward operating mode and in a reverse operating mode of the semiconductor component, and that it has other regions through which charge carriers flow only in one operating direction. The latter region occurs for example when only one region through which charge carriers flow in both operating modes is present within the drift zone. This corresponds, therefore, to the presence of only one region having zones both of the first and of the second conduction type.

In one embodiment of the semiconductor component, the size of the effective diode area is between 25 and 75 percent of the area of the cell region.

In another embodiment of the semiconductor component, it is possible for there to be no region in which the effective diode area overlaps an edge termination structure of the cell region, thereby preventing formation of an electron-hole plasma below the edge in the diode operating mode. This can have the consequence of preventing an accumulation of p-type charge carriers (holes) below the edge structure. Consequently, no restriction of the reliable operating region of the diode occurs possibly at high switching speeds.

In a further embodiment, the softness of the diode can be set by using the doping concentration of the first conduction type in the associated rear-side emitter zone. The diode softness can be improved by increasing doping magnitude of the rear-side n-type emitter zones.

Switching losses attributed to an increased doping of the n-type emitter zone can be minimized, under certain circumstances, by the above-described reduced effective diode area in comparison with the area of the cell region or the upper area of the drift zone, since one or a plurality of regions through which charge carriers do not flow in the diode operating mode exist within the drift zone in the diode operating mode. In this case, under certain circumstances, the diode softness can be improved by the increased doping concentration in the n-type emitter zone, however, such that the apparent contradiction between minimum switching power loss and maximum diode softness can now be resolved.

In a further embodiment, the diode softness is increased by an increased doping of the n-type emitter zones by doses of between $10^{15}$ 1/cm$^2$ and $10^{16}$ 1/cm$^2$.

In a further embodiment, a more extensive reconciliation of the criteria or the target conflicts is achieved by virtue of the fact that further p-type zones, which are laterally delimited, are disposed upstream directly in front of the n-type emitter zones. In this case, the p-type zones can have the same width as the adjoining n-type zones, but can also be substantially smaller or larger than them. In this case, the vertical extent of the p-type zones can be chosen with a magnitude such that they reach precisely as far as the junction between a field stop zone and the drift zone, project beyond it, or do not project beyond it. The diode softness can only be improved to a certain extent by using the doping magnitude of the n-type emitter zones. By using the p-type zones disposed upstream, it is possible to form further diodes with highly doped p- and n-type zones whose field punch-through in the case of a chopping of the current as a result of too little residual plasma in the semiconductor structure increases or re-establishes the diode softness.

In the event of a great increase in the electric field at the pn junction between n-type emitter zones and the p-type zones disposed upstream, an avalanche-multiplicative generation of electron-hole pairs can take place, whereby a continuous current flow or a soft commutation behavior can be ensured, whereas current chopping could otherwise occur in this case as a result of the depletion of the storage charge.

This can give rise to an additional degree of freedom for the increase in the diode softness independently of the doping concentration.

In a further embodiment, a reconciliation of the above-mentioned criteria can also be achieved by virtue of the fact that the drift zone has a local charge carrier lifetime zone having a greatly reduced charge carrier lifetime in comparison with the charge carrier lifetime in the rest of the drift zone. This zone does not have to extend over the entire thickness of the drift zone, but rather can be thinner. This can lead to a reduction of the storage charge in the diode. As a result, under certain circumstances, as described above, the switching power loss can be reduced without an excessively great undesired alteration of the saturation voltage of the IGBT.

A further charge carrier lifetime zone having a third charge carrier lifetime can also be arranged directly below the thin charge carrier lifetime zone having a greatly reduced charge carrier lifetime, which zone has a weakly reduced charge carrier lifetime, in the drift zone.

The charge carrier lifetime zone having a greatly reduced charge carrier lifetime and the further charge carrier zone having a weakly reduced charge carrier lifetime can extend over the entire area of the drift zone, or else only over the corresponding effective diode area.

This local charge carrier lifetime zone can be delimited to the region of the effective diode area.

FIG. 1 illustrates a sectional illustration of an IGBT including a semiconductor body 1, composed of silicon. Other materials, such as, for example, silicon carbide, AIII-BV semiconductors, etc. can also be chosen instead of silicon.

The semiconductor body 1 has on its front side Vo—incorporated into an n-conducting drift zone 2—in a cell region 3 p-conducting body regions 4, in each of which n-conducting source zones 5 are provided. There are provided on the surface of the front side of the semiconductor body 1 an insulating layer 6 composed of silicon dioxide, for example, and a metallization 7 composed of aluminum, for example, which makes contact with the body region 4 and the source zones 5. There are also incorporated into the insulating layer 6 gate electrodes 8 composed of polycrystalline silicon, for example, which produce a channel 9 when a voltage is applied between the source zone 5 and the drift zone 2. The metallization 7 extends as far as an edge region 10 containing one or a plurality of p-conducting rings 11, for example. In the edge region 10, a thick oxide, which is not designated in any further detail, is also situated on the insulating layer 6.

There are provided in the rear side Rü of this IGBT p-conducting zones 12 and n-conducting zones 13, which can have substantially identical dimensions and which are provided with a rear side metallization 14.

Figure 2A:
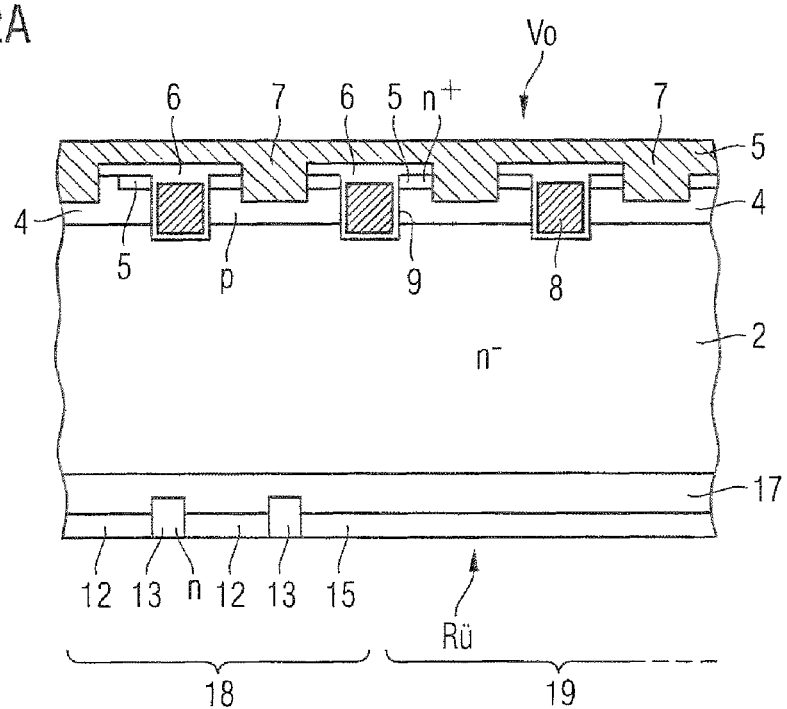
FIG. 2A illustrates a sectional illustration through an IGBT of trench embodiment according to one embodiment.

FIG. 2A illustrates one embodiment of the semiconductor component in its cell region with a semiconductor body 1 composed of silicon, for example, a drift zone 2, body regions 4, source zones 5, insulating layers 6 composed of silicon dioxide, for example, metallizations 7 composed of aluminum, for example, gate electrodes 8, p-conducting zones 12, 15 and n-conducting zones 13. In the case of this trench IGBT, the zones 13 are provided with an n-type doping. A field stop zone 17 is additionally situated in front of the p- and n-type zones 10 and 11, respectively, but it can also be omitted. The p-conducting zones and n-conducting zones have different dimensions. A first rear-side zone 18 is illustrated here, having p-conducting zones 12, 15 and n-conducting zones 13. A second rear-side region 19 only has p-conducting zones without n-conducting zones.

The trench embodiment is not mandatory, however, that is to say that all the embodiments and principles described below can also be applied to the planar embodiment of FIG. 1, where a field stop zone can likewise be provided.

The n-conducting zones 13 are configured for example in punctiform or circular fashion and form structures, such that the individual points of the structures represent rectangles or polygons, for example.

For the sake of better understanding of the figures, it is pointed out that the size relationships do not necessarily accord with reality. The spacings of the zones 12, 13 and of the gate electrodes 8 are not true to scale, under certain circumstances.

Figure 2B:
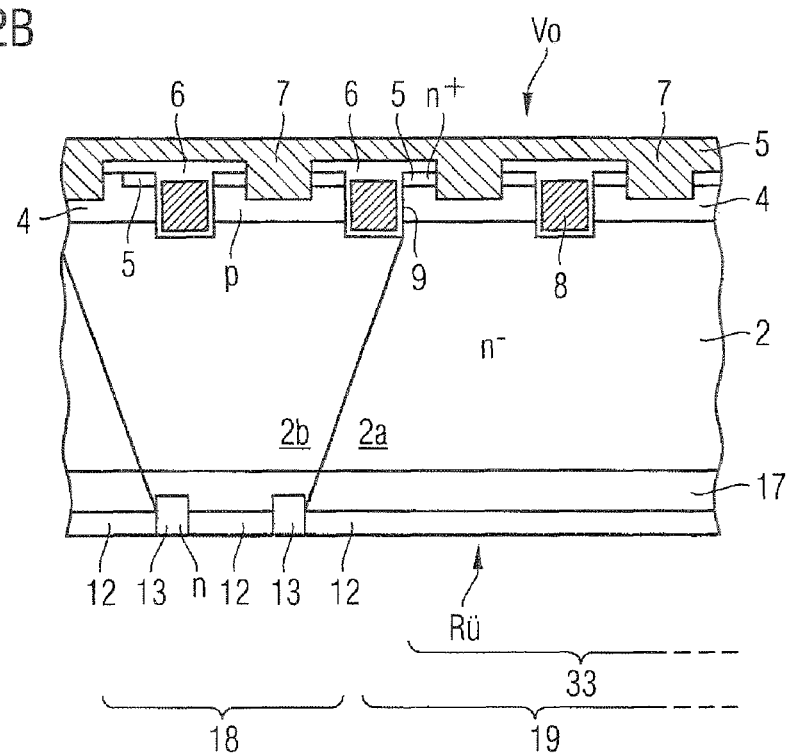
FIG. 2B illustrates a sectional illustration through the IGBT from FIG. 2A in the diode operating mode.

The semiconductor component from FIG. 2A in the diode operating mode is illustrated in FIG. 2B. Two regions 2a, 2b arise, wherein no charge carrier flooding takes place within the drift zone in the region 2a in the diode operating mode, while charge carriers flow through the region 2b. Charge carriers can flow completely through at least the region 2b in an IGBT operating mode of the semiconductor component as well. A first region 18 having p-type zones 12, 15 and n-type zones 13, and also a second region 19 having p-type zones 15 and without n-type zones 13 are illustrated. The second region 19 is so large that it contains a subregion 33 that is so far away from adjacent emitter zones 13 of the first conduction type that no charge carrier throughflow takes place within the subregion 33 in the diode operating mode.

FIG. 3 illustrates a plurality of charge carrier profiles for diode operating modes of possible semiconductor components in order to illustrate the relationship of different measures and their effects. The charge carrier concentration LK is plotted against the zone between front side Vo ("anode") and rear side Rü ("cathode") of the semiconductor component. A curve 20 illustrates the behavior of a diode that is to be designated as soft, in the case of which behavior the carrier concentration increases toward the rear side Rü without abrupt changes. A curve 21 illustrates the profile of a customary RC diode in comparison therewith. A curve 22 illustrates the effect of a local carrier lifetime reduction. A—considered locally—rapid decrease in the carrier concentration (arrow P) near the front side Vo and a uniform increase again toward the rear side Rü occur here. A curve 23 furthermore illustrates the effect of an increase in the doping concentration of the rear side n-type emitters. The charge carrier concentration at the rear side Rü is thereby increased (arrow P').

Figure 4A:
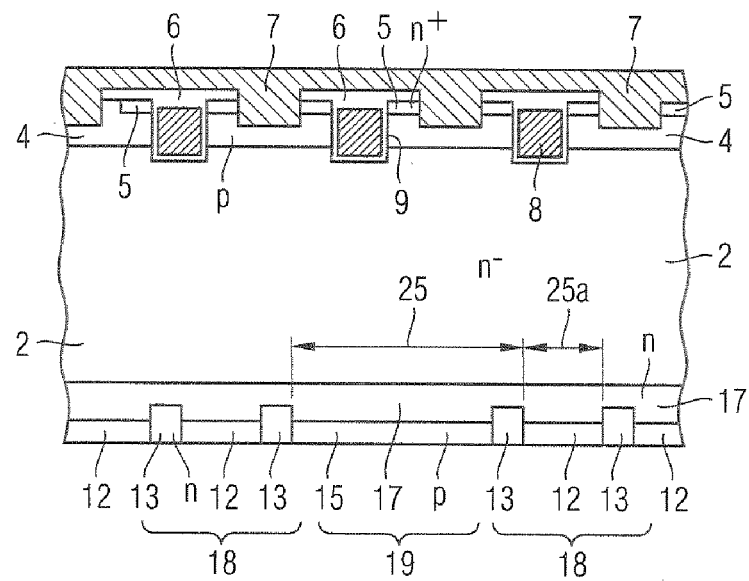
FIG. 4A illustrates a sectional illustration through an IGBT of trench embodiment according to a further embodiment.

The semiconductor component in accordance with FIG. 4A has essentially the same zones and regions as in the exemplary embodiments of FIGS. 2A and 2B. It differs from the exemplary embodiments, however, in that the rear-side n-conducting zones 13 spread over the whole area but at the same time are not distributed uniformly: n-conducting zones 13 are incorporated into a p-conducting environment (12, 15) in such a way that p-conducting zones (12, 15) arise, wherein the zones 15 are embodied in such a way that the minimum distance 25 from their center to the closest n-conducting zone 13 is substantially greater than the corresponding second minimum distance 25a in the remaining zones of the p-conduction type 12. Therefore, at least two first regions 18 having grouped or uniformly distributed p-conducting zones 12 and n-conducting zones 13, the first regions being distributed over the rear side Rü of the cell region of the semiconductor component, and also at least one second region 19 having one or more continuous p-conducting zones 15 without n-conducting zones 13 arise.

Figure 4B:
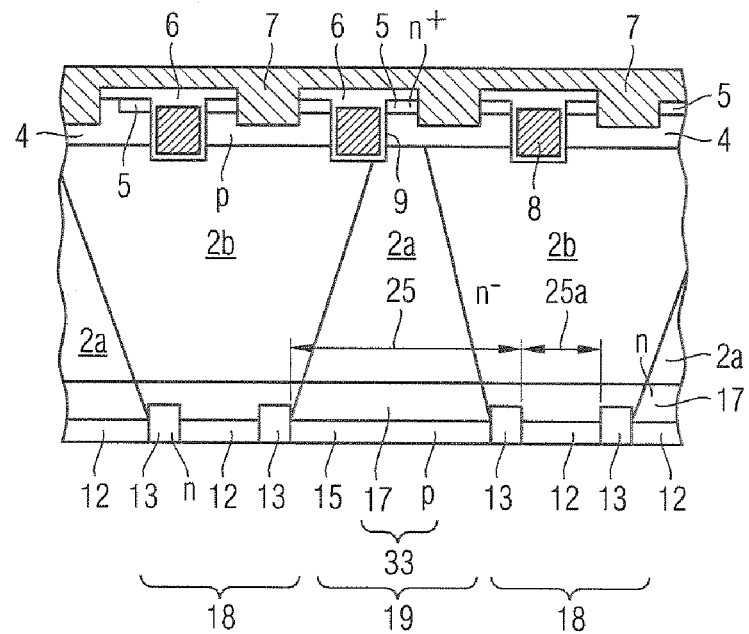
FIG. 4B illustrates a sectional illustration through the IGBT from FIG. 4A in the diode operating mode.

FIG. 4B illustrates how the drift zone is divided into at least one region 2a and at least one further region 2b in the diode operating mode of a semiconductor component from FIG. 4A. In the diode operating mode, majority charge carriers flow through the at least one region 2b, whereas no charge carrier throughflow takes place in the further region 2a. Charge carriers flow completely through the regions 2b in the IGBT operating mode of the semiconductor component, however. Charge carriers flow almost completely or completely through the regions 2a in the IGBT operating mode.

Figure 5:
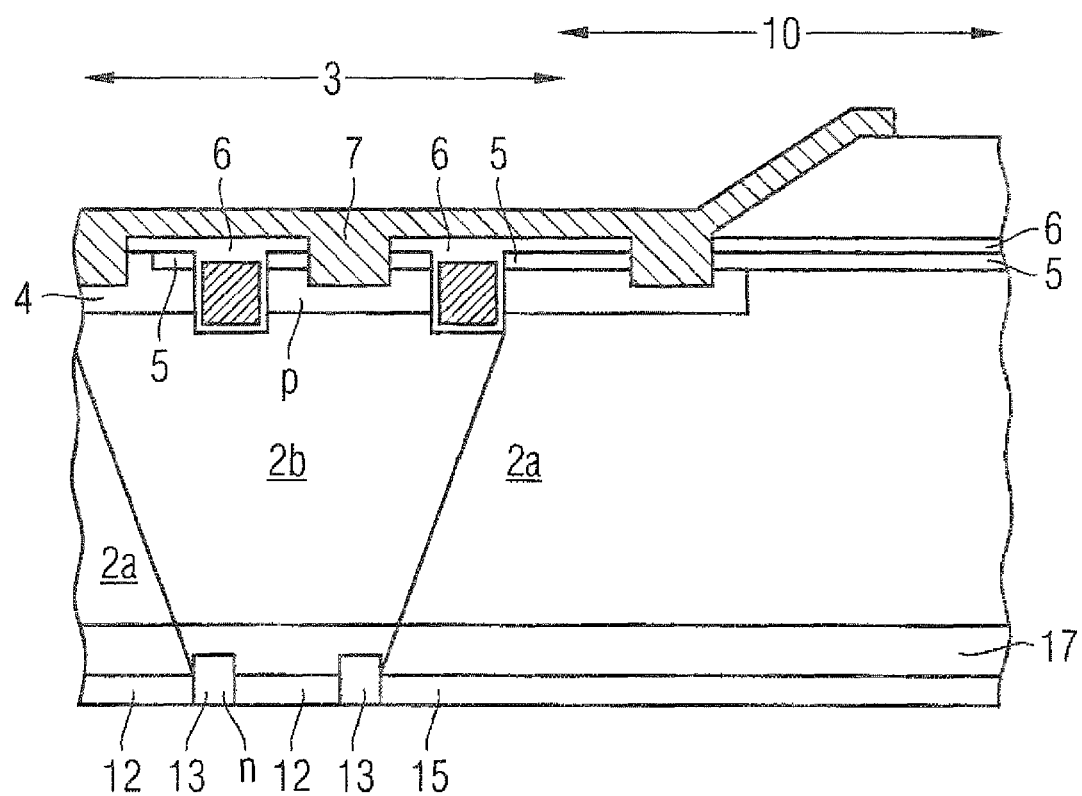
FIG. 5 illustrates a sectional illustration through an IGBT according to a further exemplary embodiment in the diode operating mode.

FIG. 5 illustrates a semiconductor component according to FIGS. 2A and 2B in the diode operating mode. The edge region 10 is also represented here in order to illustrate that the region 2b with a charge carrier throughflow in the diode operating mode does not have to extend to below the edge region 10 or to beyond the cell region 3. It likewise becomes clear here that charge carriers do not have to flow completely through at least one region 2a which extends to below the edge region 10 in a diode operating mode of the semiconductor arrangement in one embodiment below the edge region.

Figure 6A:
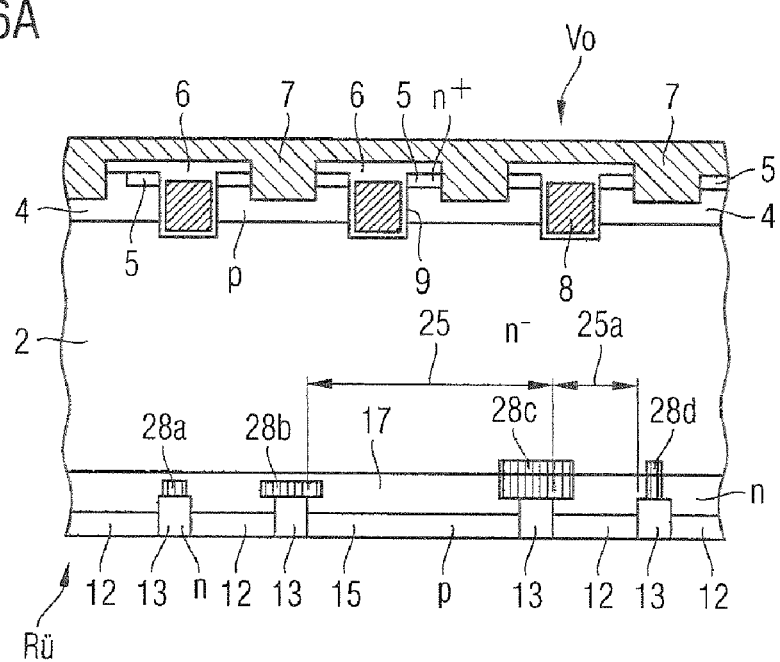
FIG. 6A illustrates a sectional illustration through an IGBT according to a further exemplary embodiment.

FIG. 6A illustrates, for a semiconductor component according to FIGS. 2A and 2B, p-type zones 28a-d disposed upstream of the n-type emitter zones 13 in possible embodiments. These p-type zones 28a-d disposed upstream have a high doping concentration and can be wider (cf. zones 28b, 28c) or narrower (cf. zones 28a, 28d) than the adjoining n-type emitter zone 13. They can lie within (cf. zones 28a, 28b) the field stop zone 17 or project beyond the latter (cf. zones 28c, 28d). These p-type zones 28a-d disposed upstream form additional diodes with highly doped p- and n-type zones in the semiconductor arrangement. They bring about an increase in the diode softness and ensure the reestablishment of a current in the case of current chopping as a result of too little residual plasma in the semiconductor structure.

Figure 6B:
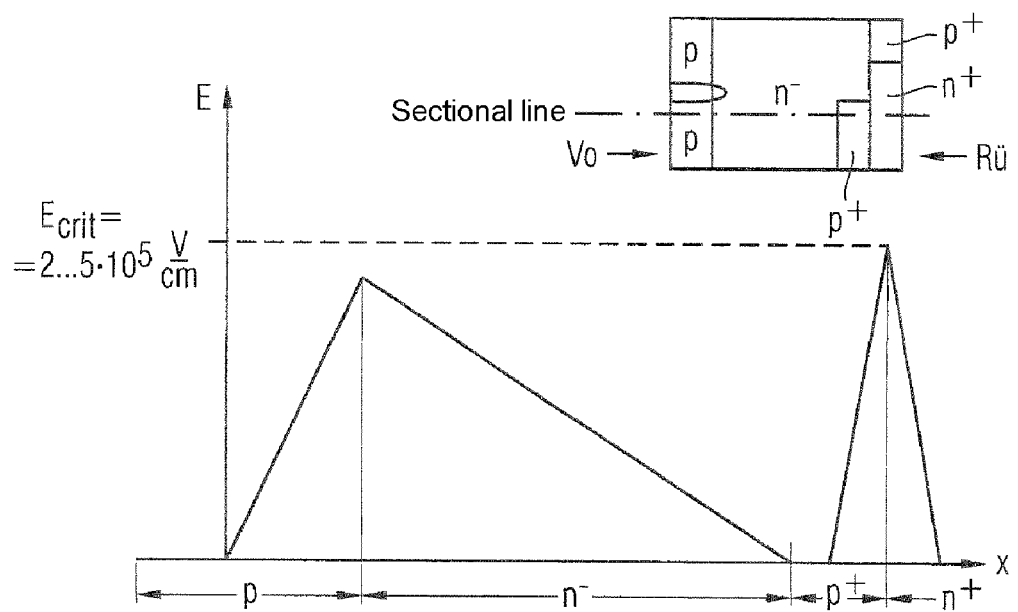
FIG. 6B illustrates the characteristic curve of the electric field distribution between front side and rear side of an IGBT according to an embodiment according to FIG. 6A.

FIG. 6B illustrates a distribution of the electric field strength between front side Vo and rear side Rü of the semiconductor component in a section through a front-side p-type zone, a drift region, a p-type zone disposed upstream as in FIG. 6A, and a rear-side n-type emitter zone during the turn-off or depletion of the diode, at the time when the charge carriers have been depleted in the zone between the body region 4 and a p-type zone 28*d* disposed upstream. The sectional course between front side Vo and rear side Rü is illustrated at the top on the right in the figure. The curve profile illustrates a commencement and a rise of the electric field within the front-side p-type zone as far as the adjoining drift region, in which the field strength decreases relatively as far as the in turn adjoining p-type zone disposed upstream, but without being totally extinguished. Within the p-type zone disposed upstream, the field strength rises again to the rear-side n-type emitter zone and can reach larger values than within the front-side p-type zone or the drift zone. Within the rear-side n-type emitter zone, the field strength finally decreases and tends toward zero. If a current flow within the drift zone threatens to undergo chopping, the p-type zone disposed upstream ensures, by using at least one diode formed by a p-type zone disposed upstream and a rear-side n-type emitter zone, that a current flow is maintained because additional charge carriers are generated by avalanche generation when a critical field strength of $2 \cdot 10^5$ V/cm to $5 \cdot 10^5$ V/cm is reached.

Figure 7A:
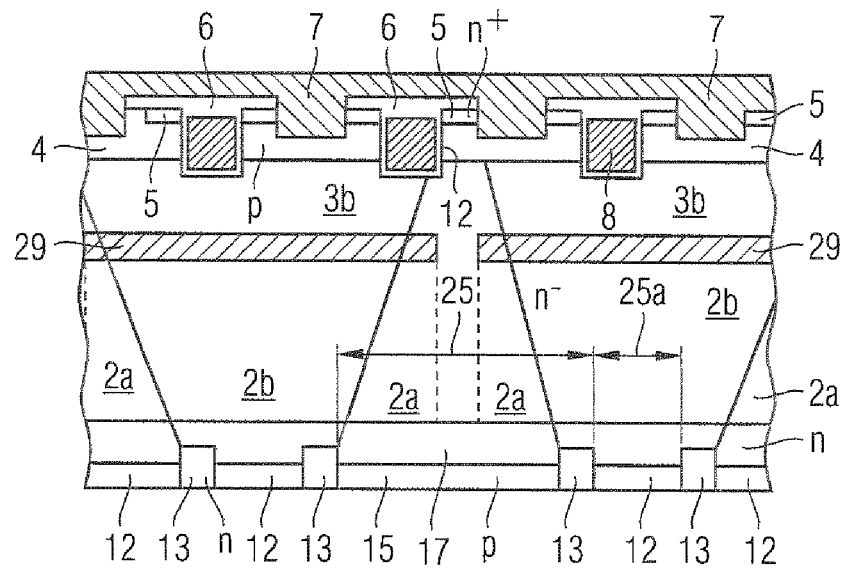
FIG. 7A illustrates a sectional illustration through an IGBT according to a further exemplary embodiment in the diode operating mode.

FIG. 7A illustrates the diode operating mode of a semiconductor component according to FIGS. 2A and 2B in the diode operating mode, wherein at least one additional zone 29 can be arranged in the drift zone 2. The at least one zone 29 can have a greatly reduced charge carrier lifetime. Its area extends, in this example, over the region of charge carrier flooding in the diode operating mode, that is to say over the effective diode area. On account of an approximately frusto-conical propagation characteristic of the charge carrier flooding within the drift zone 2, the area extent of the zone 29 can vary depending on its position within the drift zone 2. A size of the at least one additional zone 29 can be chosen such that it completely covers the region of the charge carrier throughflow in the diode operating mode. The zone 29 can restrict the charge carrier flooding in the diode operating mode. The switching power loss of the semiconductor component can thereby be reduced. The regions 2*a* and 2*b* and/or 3*b* can have a non-reduced or a weakly reduced charge carrier lifetime in contrast to the zone 29, wherein charge carriers flow through the regions 2*b* in contrast to the regions 2*a* in the diode operating mode.

Figure 7B:
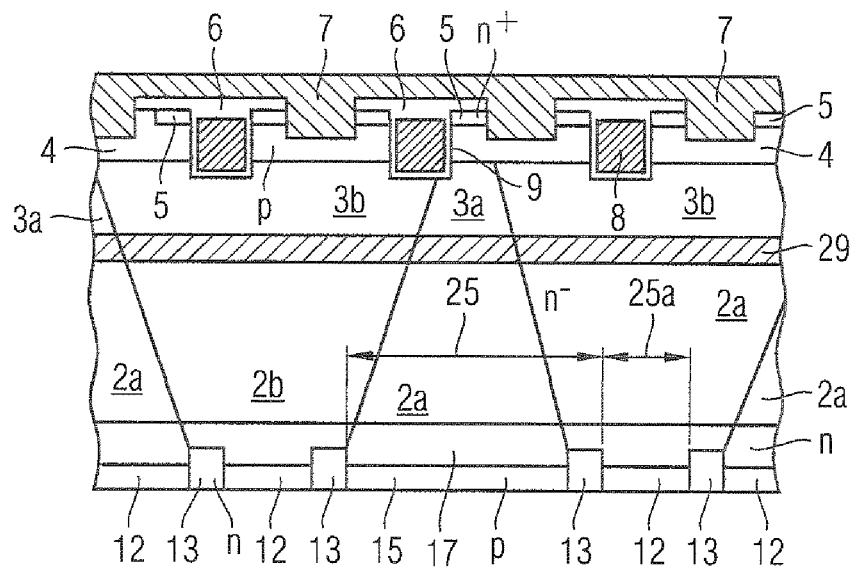
FIG. 7B illustrates a sectional illustration through an IGBT according to a sixth exemplary embodiment in the diode operating mode.

Another embodiment of the at least one zone 29 having a reduced charge carrier lifetime is illustrated in FIG. 7B. Here the zone 29 is arranged continuously within the drift zone 2 and can serve the same purpose as in FIG. 7A. The regions 2*a* and 2*b* can likewise have a weakly reduced charge carrier lifetime or a non-reduced charge carrier lifetime, while the regions 3*a* and 3*b* do not have a reduced charge carrier lifetime.

Figure 8A:
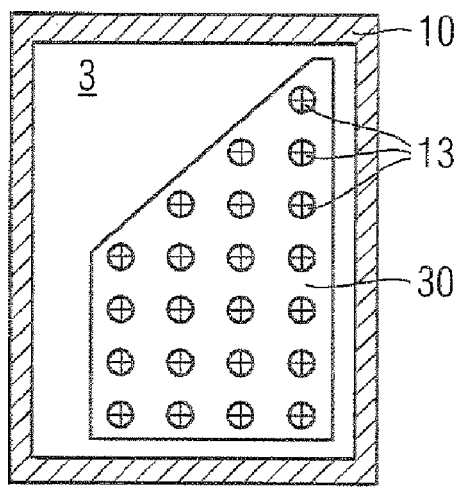
FIG. 8A illustrates a plan view of structures of n-conducting zones in the cell region of a semiconductor arrangement.
Figure 8B:
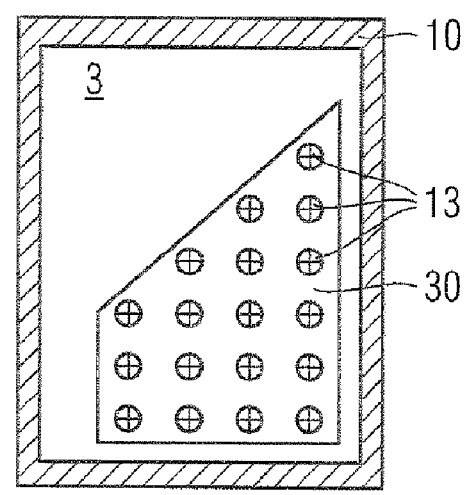
FIG. 8B illustrates a plan view of structures of n-conducting zones in the cell region of the semiconductor arrangement.
Figure 8C:
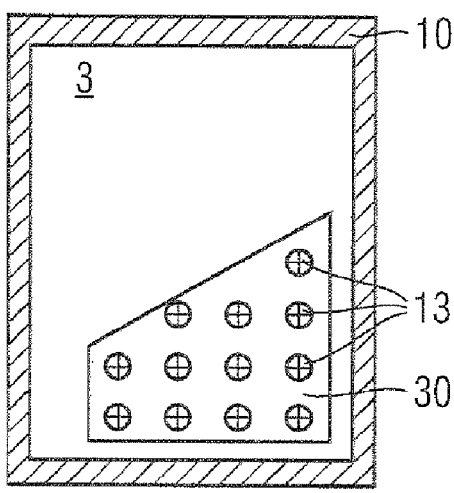
FIG. 8C illustrates a plan view of structures of n-conducting zones in the cell region of the semiconductor arrangement.
Figure 8D:
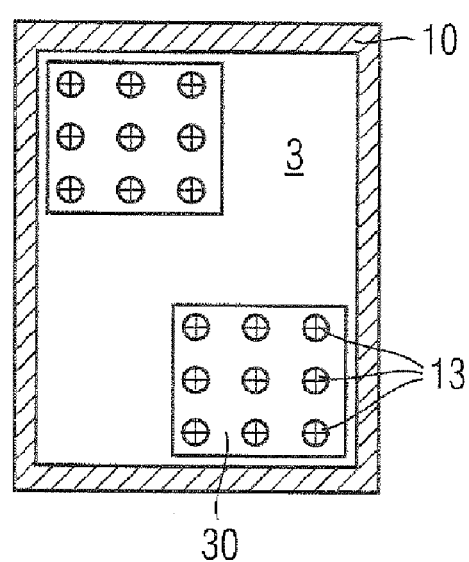
FIG. 8D illustrates a plan view of structures of n-conducting zones in the cell region of the semiconductor arrangement.

FIGS. 8A to 8D illustrate plan views of cell regions of semiconductor structures according to FIGS. 2A and 2B with the underlying n-type emitter zones 13. In this case, the at least one effective diode area 30 in FIG. 8A covers a portion of the cell region 3. These portions become smaller and smaller in FIGS. 8B to 8C. Two groupings of the n-type emitter zones 13 are illustrated in FIG. 8D.

Figure 9A:
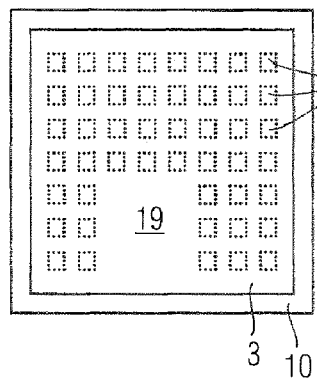
FIG. 9A illustrates a plan view of structures of n-conducting zones in the cell region of the semiconductor arrangement.
Figure 9B:
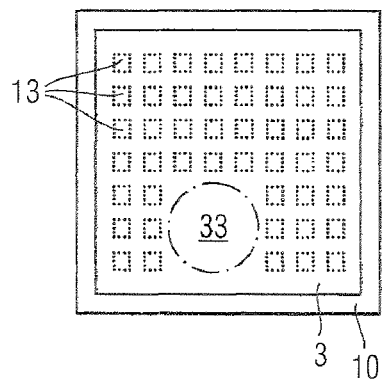
FIG. 9B illustrates a plan view of structures of n-conducting zones in the cell region of the semiconductor arrangement.
Figure 9C:
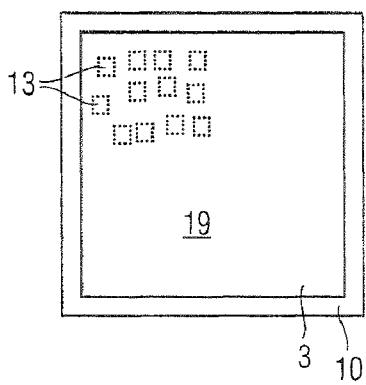
FIG. 9C illustrates a plan view of structures of n-conducting zones in the cell region of the semiconductor arrangement.
Figure 9D:
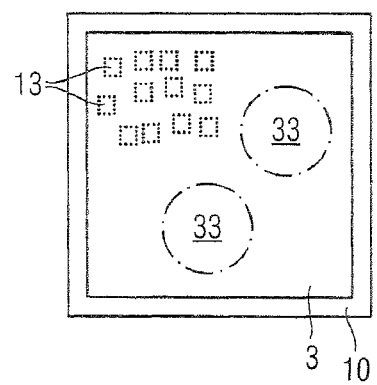
FIG. 9D illustrates a plan view of structures of n-conducting zones in the cell region of the semiconductor arrangement.
Figure 9E:
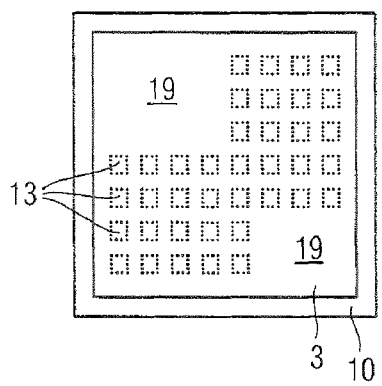
FIG. 9E illustrates a plan view of structures of n-conducting zones in the cell region of the semiconductor arrangement.
Figure 9F:
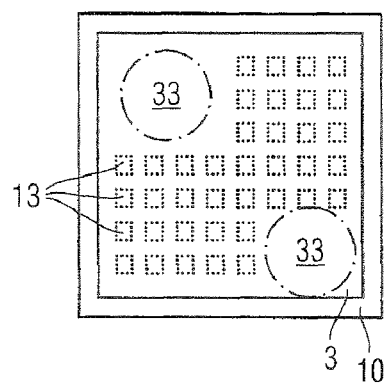
FIG. 9F illustrates a plan view of structures of n-conducting zones in the cell region of the semiconductor arrangement.
Figure 9G:
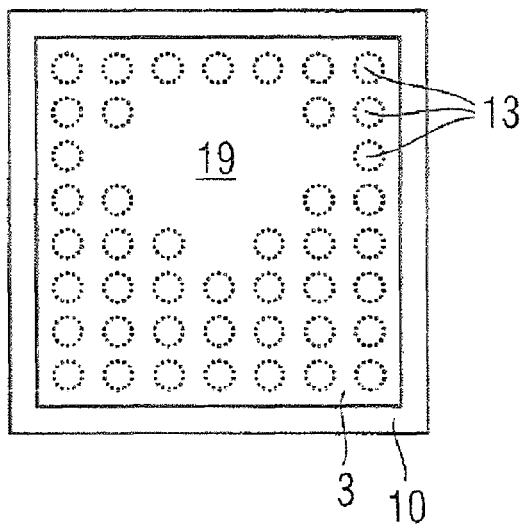
FIG. 9G illustrates a plan view of structures of n-conducting zones in the cell region of the semiconductor arrangement.
Figure 9H:
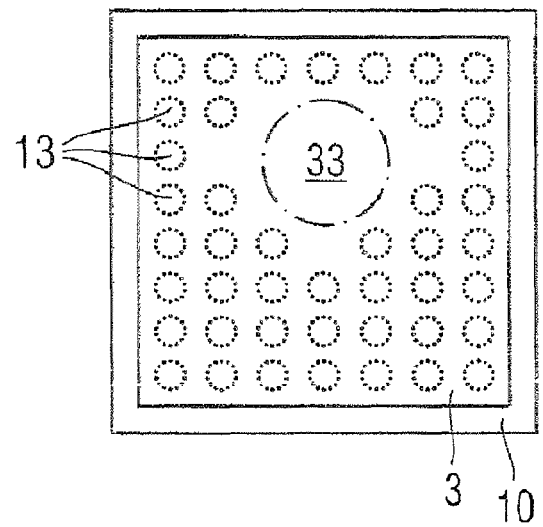
FIG. 9H illustrates a plan view of structures of n-conducting zones in the cell region of the semiconductor arrangement.
Figure 9I:
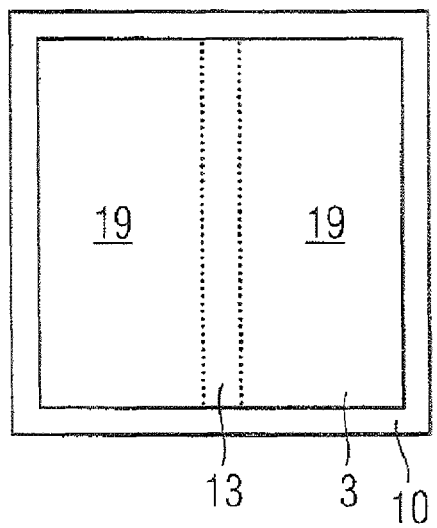
FIG. 9I illustrates a plan view of structures of n-conducting zones in the cell region of the semiconductor arrangement.
Figure 9J:
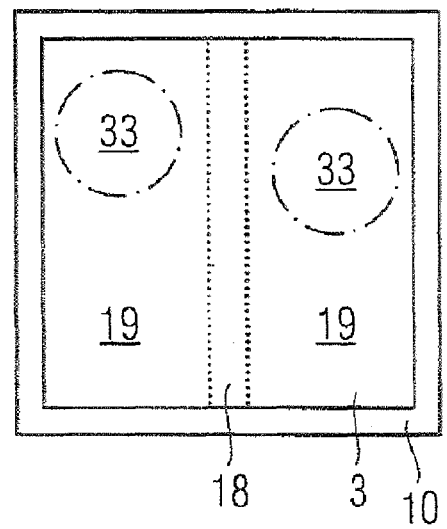
FIG. 9J illustrates a plan view of structures of n-conducting zones in the cell region of the semiconductor arrangement.

FIGS. 9A to 9J likewise illustrate plan views of cell regions of semiconductor structures according to FIGS. 2A and 2B with underlying n-type emitter zones 13. The edge regions 10, the cell regions 3 and the n-type emitter zones 13 are illustrated in each case. FIG. 9A illustrates a second region 19 without n-type zones 13 contained therein, while FIG. 9B illustrates the corresponding subregion 33, in which no charge carrier throughflow takes place in the diode operating mode. Analogously to this, FIGS. 9C and 9D, 9E and 9F, and 9G and 9H, illustrate the second regions 19 without n-type emitter zones 13 and, respectively, the subregions 33 without charge carrier throughflow in the diode operating mode. For illustration purposes, circular areas are depicted as partial areas, which circular areas are enclosed by the surface or surfaces of the at least one second region 19, which form the subregions 33. FIG. 9I illustrates second regions 19 and an n-type emitter zone elongated over a length of the cell region 3. FIG. 9J illustrates a first region 18, which can contain an elongated n-type emitter zone as in FIG. 9I, or else a plurality of distributed n-type emitter zones. The illustration additionally illustrates two second regions 19 and also circular areas contained therein, for illustrating possible subregions 33, with such circular areas having a diameter of at least four times a thickness of the drift zone 2.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
a semiconductor body having a cell region, with at least one zone of a first conduction type and at least one zone of a second conduction type in a rear side and contains a drift zone of the first conduction type in the cell region;
wherein the rear side contains both at least one region having zones of the first and of the second conduction type and at least one further region of the second conduction type which has, as partial area, at least one circular area having a diameter of at least four times a thickness of the drift zone and which contains no zones of the first conduction type.

2. The semiconductor component of claim 1, comprising wherein a doping concentration in the at least one zone of the first conduction type is increased in comparison with a doping concentration of the drift zone.

3. The semiconductor component of claim 1, comprising wherein in the at least one zone of the first conduction type, a doping concentration is achieved by using a doping dose of between $10^{15}/\text{cm}^2$ and $10^{16}/\text{cm}^2$.

4. The semiconductor component of claim 1, comprising wherein a laterally delimited further zone of the second conduction type is arranged directly in front of the at least one zone of the first conduction type.

5. The semiconductor component of claim 4, comprising wherein a field punch-through at the at least one further zone makes it possible to prevent a chopping of a current flow in the event of a rise in an electric field at a diode comprising the zone of the first conduction type.

6. The semiconductor component of claim 1, comprising wherein the drift zone of the first conduction type comprises at least two zones having different charge carrier lifetimes.

7. The semiconductor component of claim 6, comprising wherein one zone has a greatly reduced charge carrier lifetime in comparison with another of the at least two zones.

8. The semiconductor component of claim 6, comprising wherein one zone is a local zone in the vertical direction having a greatly reduced charge carrier lifetime in comparison with that in the zone and the drift zone has a second zone having a weakly reduced charge carrier lifetime in comparison with that in the zone.

9. A method for producing the semiconductor component of claim 1, including a semiconductor body having a cell region comprising:
   forming in the cell region of the semiconductor body a drift zone of a first conduction type;
   forming at least one region having exclusively zones of a second conduction type on a rear side of the semiconductor body; and
   forming at least one region having zones both of the first conduction type and of the second conduction type on the rear side, wherein the at least one region having zones of the second conduction type has as a partial area at least one circular area having a diameter of at least four times a thickness of the drift zone and contains no zones of the first conduction type.

* * * * *

UNITED STATES PATENT AND TRADEMARK OFFICE
CERTIFICATE OF CORRECTION

PATENT NO.        : 8,860,133 B2                    Page 1 of 1
APPLICATION NO.   : 13/722419
DATED             : October 14, 2014
INVENTOR(S)       : Holger Ruething et al.

It is certified that error appears in the above-identified patent and that said Letters Patent is hereby corrected as shown below:

On the title page, item (30) Foreign Application Priority Data: delete "Oct. 25, 2007" and insert in place thereof --Oct. 25, 2006--.

Signed and Sealed this
Eleventh Day of August, 2015

Michelle K. Lee
*Director of the United States Patent and Trademark Office*